United States Patent
Shibata et al.

(10) Patent No.: US 6,765,244 B2
(45) Date of Patent: Jul. 20, 2004

(54) III NITRIDE FILM AND A III NITRIDE MULTILAYER

(75) Inventors: Tomohiko Shibata, Nagoya (JP); Shigeaki Sumiya, Nagoya (JP); Keiichiro Asai, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/156,595

(22) Filed: May 28, 2002

(65) Prior Publication Data

US 2002/0190275 A1 Dec. 19, 2002

Related U.S. Application Data

(60) Provisional application No. 60/303,126, filed on Jul. 5, 2001.

(30) Foreign Application Priority Data

Jun. 15, 2001 (JP) .................................. 2001-181859
Sep. 4, 2001 (JP) .................................. 2001-266810

(51) Int. Cl.[7] .................................. H01L 31/0328
(52) U.S. Cl. .................. 257/200; 257/627; 257/628
(58) Field of Search ................. 257/200, 627, 257/628

(56) References Cited

U.S. PATENT DOCUMENTS 6,495,894 B2 * 12/2002 Shibata et al. .............. 257/428
6,583,468 B2 * 6/2003 Hori et al. .................. 257/327
6,649,493 B2 * 11/2003 Asai et al. .................. 438/481
2002/0020850 A1   2/2002 Shibata et al.

OTHER PUBLICATIONS

Leszczynski, M., et al., "GaN homoepitaxial layers grown by metalorganic chemical vapor deposition," Aug. 30, 1999, Appl. Phys. Lett., vol. 27, No. 9, pp1276–78.*
Shen, B., et al., "Growth of wirtzite GaN films . . . ," 1999, Appl. Phys. A, 68, 593–96.*
Arakawa, Yasuhiko, Hirayama, Yoshiro, Kishino, Katsumi, Yamaguchi, Hiroshi, *New buffer layer technique using underlying epitaxial A1N films for high–quality GaN growth*, Compound Semiconductors 2001, Proceedings of the Twenty–Eighth International Symposium on Compound Semiconductors held in Tokyo, Japan, Oct. 1–4, 2001, Institute of Physics Conference Series No. 170, pp. 795–800.

* cited by examiner

*Primary Examiner*—Sara Crane
(74) *Attorney, Agent, or Firm*—Burr & Brown

(57) ABSTRACT

A III nitride multilayer including a given substrate, a III nitride underfilm including an Al content of 50 atomic percent or more for all of the III elements present in the III nitride underfilm, and a III nitride film including a lower Al content than the Al content of the III nitride underfilm by 10 atomic percent or more. A full width at half maximum X-ray rocking curve value of the III nitride film is set to 800 seconds or below at the (100) plane. A full width at half maximum X-ray rocking curve value of the III nitride film is set to 200 seconds or below at the (002) plane.

12 Claims, 2 Drawing Sheets

III NITRIDE FILM AND A III NITRIDE MULTILAYER

CROSS REFERENCE TO RELATED APPLICATION

This application claims the benefit of U.S. Provisional Application Serial No. 60/303,126 filed Jul. 5, 2001, Japanese Application 2001-181,859 filed Jun. 15, 2001 and Japanese Application 2001-266,810, filed Sep. 4, 2001, the entireties of which are incorporated herein by reference.

BACKGROUND OF THE INVENTION (1) Field of the Invention

This invention relates to a III nitride film and a III nitride multilayer structure, particularly usable for a semiconductor light-emitting element such as a light-emitting diode or a semiconductor element such as a high velocity IC chip.

(2) Related Art Statement

III nitride films are used as semiconductor films for light-emitting diodes, and recently get attention as semiconductor films for high velocity IC chips for cellular phones. In view of application for field emitters, much attention is particularly paid to Al-including III nitride films.

Conventionally, such an Al-including film is fabricated by a MOCVD method in which trimethyl aluminum (TMA) or triethyl aluminum (TEA) is employed as an Al raw material gas, and ammonia ($NH_3$) is employed as a nitrogen raw material gas. In this case, a substrate on which the III nitride film is formed is set on a susceptor installed in a reactor and is heated to around 1000° C. by a heater provided in or out of the susceptor. Then, the Al raw material gas, the nitrogen raw material gas and another raw material gas including other additive elements are introduced with a given carrier gas into the reactor and supplied onto the substrate.

The raw material gases thermochemically react on the substrate, and the thus decomposed constituent elements chemically react to deposit a desired III nitride film on the substrate. In order to obtain a semiconductor element as designed, it is required that the crystallinity of the III nitride film should be improved.

FIG. 1 is a perspective view showing a crystal structure unit of a normal III nitride such as a GaN film, and FIG. 2 is a graph showing the relation in X-ray rocking curve between the (100) plane and the (002) plane of the III nitride films.

The X-ray rocking curve is normally measured by means of a method disclosed in "J. Appl. Phys. Vol. 38(1999), pp. L611–613". In the measuring method, an X-ray is introduced onto a crystal plane to measure the X-ray rocking curve such that the X-ray is reflected symmetrically from the crystal plane. In the above document, full widths at half maximum (FWHMs) X-ray rocking curve values for various crystal planes of the III nitride film are listed in Table. 1. It is reported in the document that the Twist component corresponding to the FWHM X-ray rocking curve value at the (100) plane is 0.33 degrees (=1188 seconds) and the Tilt component corresponding to the FWHM X-ray rocking curve value at the (002) plane is 0.09 degrees (=324 seconds), in the case that GaN is fabricated without the application of special growth techniques such as the ELO technique.

In view of the crystallinity of the III nitride film, the mosaicity at the (001) plane (or (002) plane) and the mosaic property at the (100) plane parallel to the C-axis of the III nitride film must be considered. The crystallinity of the GaN film grown without the application of special growth techniques such as the ELO technique satisfies the relation shown in FIG. 2.

The crystallinity of the Al-including III nitride film does not satisfy a specific relation as shown in FIG. 2, and it is considered that the crystallinity of the Al-including III nitride film is relatively inferior to that of the GaN film because it has difficulty in being formed in high crystallinity, as compared with the GaN film.

In the case of the low crystallinity of the III nitride film, the FWHM X-ray rocking curve value at the (002) plane and the FWHM X-ray rocking curve value at the (100) plane satisfies the relation of region B. On the other hand, in the case of the high crystallinity of the III nitride film, the FWHM in X-ray rocking curve at the (002) plane and the FWHM X-ray rocking curve at the (100) plane satisfies the relation of region A.

In the region B, therefore, the FWHM X-ray rocking curve value at the (100) plane increases as the FWHM X-ray rocking curve value at the (001) plane increases. That is, the crystallinity of the (100) plane increases as the crystallinity of the (001) plane increases.

In the region A, however, the tendency of the FWHM X-ray rocking curve value at the (100) plane is contrary to that of the FWHM X-ray rocking curve value at the (001) plane. That is, the FWHM X-ray rocking curve value at the (100) plane increases as the FWHM X-ray rocking curve value at the (001) plane decreases, so the crystallinity of the (100) plane increases as the crystallinity of the (001) plane decreases.

It is obviously required that the III nitride film has a high crystallinity so as to construct a semiconductor element, and as a result, in many cases, the relation between the crystallinities of the (100) plane and the (001) plane are dominated in the region A shown in FIG. 2. In this case, conventionally, the crystallinities of the (100) plane and the (001) plane can not be improved simultaneously, and thus, balanced in a given condition, to maintain the total crystallinity of the III nitride film in a given condition.

SUMMARY OF THE INVENTION

It is an object of the present invention to provide an Al-including III nitride film which has the higher crystallinities of the (100) plane and the (001) plane simultaneously, and a III nitride multilayer usable as an underlayer for a semiconductor element which utilizes the III nitride film.

In order to achieve the above object, this invention relates to a III nitride film including a full width at half maximum X-ray rocking curve value of 800 seconds or below at the (100) plane, and a full width at half maximum X-ray rocking curve value of 200 seconds or below at the (002) plane.

In a conventional III nitride film, if the FWHM X-ray rocking curve value at the (002) plane, that is, at the (001) plane is set to 200 seconds or below, the FWHM X-ray rocking curve value at the (100) plane is beyond 800 seconds, and for example, set to around 1000 seconds. In this case, therefore, the crystallinity of the (100) plane can not be enhanced sufficiently.

In the III nitride film of the present invention, on the contrary, even though the FWHM X-ray rocking curve value at the (002) plane is set to 200 seconds or below, the FWHM X-ray rocking curve value at the (100) plane can be set to 800 seconds or below. Therefore, the cystallinities of the (100) plane and the (001) plane can be developed simultaneously.

In a preferred embodiment of the III nitride film of the present invention, the FWHM X-ray rocking curve value at the (100) plane is set to 500 seconds or below, and the FWHM X-ray rocking curve value at the (002) plane is set to 150 seconds or below. That is, even though the FWHM X-ray rocking curve value of the (002) plane is set to 500 seconds or below so as to develop the crystallinity of the (001) plane, the FWHM X-ray rocking curve value at the (100) plane can be set to 500 seconds or below, to develop the crystallinity of the (100) plane sufficiently.

The III nitride film satisfying the requirement of the present invention may be fabricated as follows. First of all, a III nitride underfilm having an Al content of 50 atomic percent or more for all of the III elements is formed in a given thickness on a given substrate by means of a CVD method. Then, the III nitride film is formed on the III nitride underfilm so that the Al content of the III nitride film is set lower than the Al content of the III nitride underfilm by 10 atomic percent or more. In this case, the crystallinity of the III nitride film is improved, originated from the difference in Al content between the III nitride underfilm and the III nitride film, so that both of the crystallinities of the (100) plane and the (001) plane can be developed.

This invention also relates to a III nitride multilayer structure including a given substrate, a III nitride underfilm including an Al content of 50 atomic percent or more for all of the III elements, and a III nitride film including a lower Al content than the Al content of the III nitride underfilm by 10 atomic percent or more. A full width at half maximum X-ray rocking curve value of the III nitride film is set to 800 seconds or below at the (100) plane. A full width at half maximum X-ray rocking curve value of the III nitride film is set to 200 seconds or below at the (002) plane. The III nitride multilayer structure is made through the fabricating process of the III nitride film of the present invention.

The III nitride multilayer structure includes the high crystallinity III nitride film on the top, so it is preferably usable as an underfilm for a semiconductor element.

BRIEF DESCRIPTION OF THE DRAWINGS

For better understanding of the present invention, reference is made to the attached drawings, wherein.

DETAILED DESCRIPTION OF THE INVENTION

Figure 1:
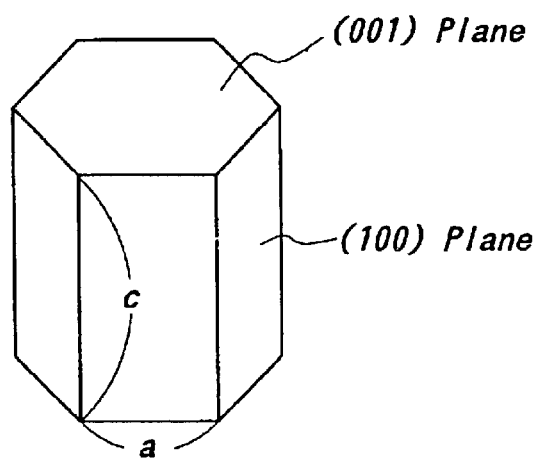
FIG. 1 is a perspective view showing a typical crystal structure unit of a III nitride film.
Figure 2:
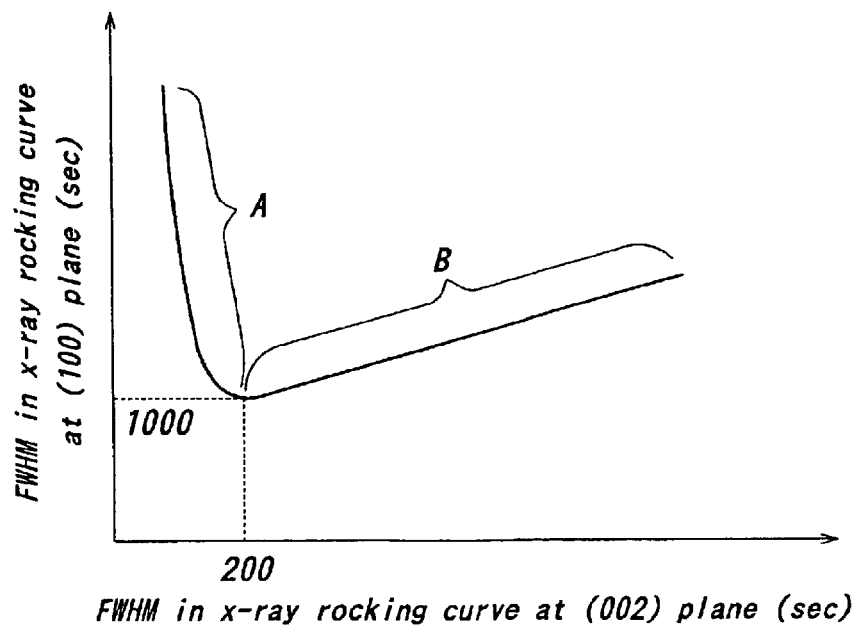
FIG. 2 is a graph showing the relation of the FWHM X-ray rocking curve value of the (002) plane and the FWHM in X-ray rocking curve of the (100) plane.

This invention will be described in detail, hereinafter.

In the III nitride film of the present invention, even though the FWHM X-ray rocking curve value at the (002) plane is set to 200 seconds or below, the FWHM X-ray rocking curve value at the (100) plane can be maintained at 800 seconds or below. In the preferred embodiment as mentioned above, even though the FWHM X-ray rocking curve value at the (002) plane is set to 150 seconds or below, the FWHM X-ray rocking curve value at the (100) plane can be maintained at 500 seconds or below.

In fabricating the III nitride film, the Al content of the III nitride underfilm is preferably set to 70 atomic percent or more for all of the III elements, and particularly, the III nitride underfilm is made of an AlN film (100 atomic percent of Al content). Moreover, the III nitride underfilm is made at 1100° C. or more by means of a CVD method. In this case, the crystallinity of the III nitride underfilm can be easily developed. As a result, the crytallinity of the III nitride film to be formed on the III nitride underfilm can be easily developed.

In addition, the III nitride underfilm is preferably made at 1250° C. or below. Beyond 1250° C, the surface roughness of the III nitride underfilm and the composition ununiformity in the III nitride underfilm due to the inter-diffusion may occur. In the present invention, the above temperature range means a substrate temperature is predetermined.

In the fabricating the III nitride film, the difference in Al content between the III nitride underfilm and the III nitride film is preferably set to 20 atomic percent or more, to form a boundary surface therebetween. In this case, both of the crystallinities of the (100) plane and the (001) plane are improved, so the requirement in FWHM of X-ray rocking curve for the III nitride film can be easily satisfied.

The thickness of the III nitride underfilm depends on the sort and the crystallinity of the III nitride film to be formed, and is preferably set to 0.5 $\mu$m or more, particularly within 1–3 $\mu$m.

In order to enhance the crystallinity of the III nitride film, it is desired that the III nitride underfilm is formed thick. However, if the III nitride underfilm is formed too thick, some cracks and exfoliation may be generated in the underfilm. Therefore, if the III nitride underfilm with high crystallinity is formed within the above-mentioned temperature range, it is desired that the thickness of the III nitride underfilm is set within the above-mentioned thickness range.

As a substrate on which the III nitride film and the III nitride underfilm are formed, are exemplified an oxide single crystal as sapphire single crystal, ZnO single crystal, LiAlO$_2$ single crystal, LiGaO$_2$ single crystal, MgAl$_2$O$_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as ZrB$_2$.

In the case of employing the sapphire single crystal as the substrate, it is desired that a main surface of the substrate on which the III nitride underfilm and the III nitride film are formed is heated and treated under a nitrogen atmosphere including NH$_3$ or the like. In this case, a surface nitrided layer is created at the surface region of the substrate. The thickness of the surface nitrided layer is controlled by appropriately adjusting the nitrogen concentration, the nitriding temperature and the nitriding period of time.

If the III nitride underfilm is formed on the substrate via the surface nitrided layer, the crystallinity can be more enhanced. Moreover, the III nitride underfilm can be easily formed thick, e.g., to the upper limited value of 3 $\mu$m as mentioned above can be achieved without a specific forming condition. Therefore, the crystallinity of the III nitride film to be formed on the III nitride underfilm can be easily enhanced.

In this case, even though in forming the III nitride underfilm, the temperature of the substrate is set to 1200° C. or below, particularly around 1150° C., the III nitride film with high crystallinity can be easily formed.

The surface nitrided layer is preferably formed thin in a thickness of 1 nm or below, or formed thick so that the nitrogen content at a depth of 1 nm from the main surface of the substrate 11 is set to 2 atomic percent or below.

It is required that the III nitride film and the III nitride underfilm include Al element. In addition, the films may include another III element such as Ga element or In element. Also, the films may contain an additive element such as Ge, Si, Mg, Zn, Be, P, or B, and a minute impurity contained in the raw material gases and the reactor or contained dependent on the forming condition.

The III nitride multilayer of the present invention includes the above-mentioned III nitride underfilm and the above-mentioned III nitride film which is formed on the underfilm.

Figure 3:
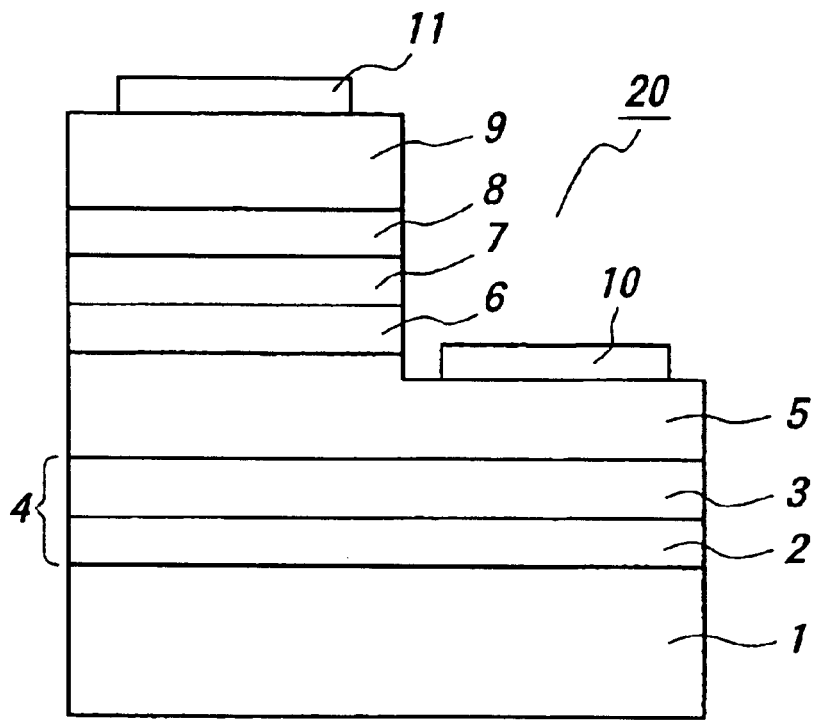
FIG. 3 is a structural view showing a semiconductor light-emitting element including a III nitride multilayer according to the present invention.

FIG. 3 is a structural view showing a semiconductor light-emitting element which is composed of a III nitride multilayer made of a III nitride film and a III nitride underfilm as mentioned above, and plural III nitride films which are formed on the III nitride multilayer.

In a semiconductor light-emitting element 20 shown in FIG. 3, a III nitride underfilm 2 and a III nitride film 3 are formed on a substrate 1 made of e.g., sapphire single crystal and satisfy the above-mentioned requirements of the present invention. The III nitride underfilm 2 and the III nitride film 3 constitute an underfilm 4 for a semiconductor element.

On the underfilm 4 are formed a first conductive layer 5, a first cladding layer 6, a light-emitting layer 7, a second cladding layer 8 and a second conductive layer 9 which in turn are made of their respective III nitride films. The thus obtained semiconductor element 20 is partially etched and removed in the thickness direction, to partially expose the first conductive layer 5. A first electrode 10 is made on the exposed surface of the first conductive layer 5 and a second electrode 11 is made on the second conductive layer 9.

A given current is injected into the light-emitting layer 7 via the first and the second conductive layers 5 and 9 by applying a given voltage between the first electrode 10 and the second electrode 11, to generate and emit a given light through the excitation.

In the semiconductor element 20 shown in FIG. 3, since the conductive layers 5 and 9, the cladding layers 6 and 8, and the light-emitting layer 7 are formed on the underfilm 4 with high crystallinity, their crystallinities are improved and enhanced. Therefore, a desired light can be generated and emitted from the semiconductor light-emitting element 20 at a high luminous efficiency, originated from the higher crystallinity.

Figure 4:
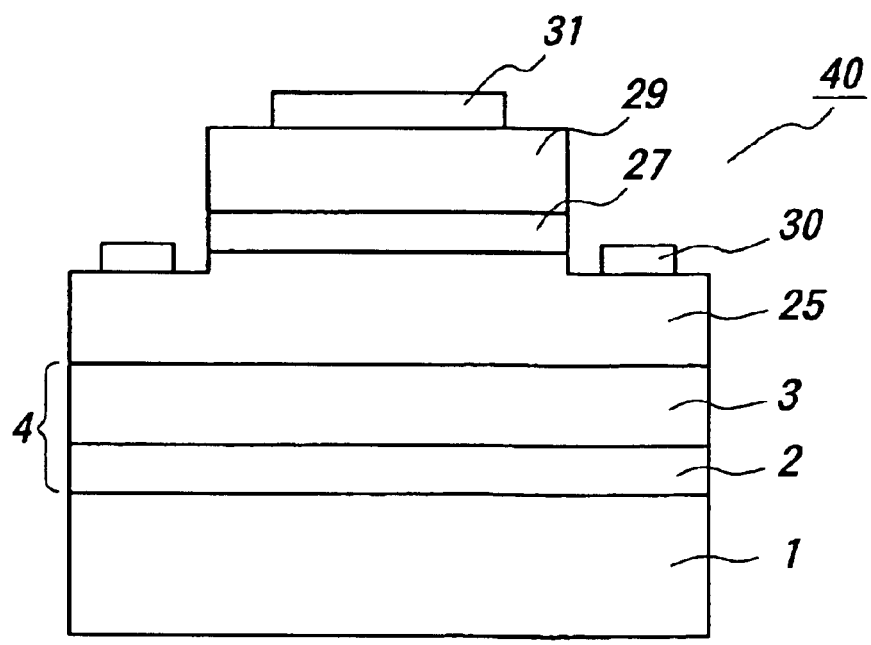
FIG. 4 is a structural view showing a semiconductor light-detecting element including a III nitride multilayer according to the present invention.

FIG. 4 is a structural view showing a semiconductor light-detecting element which is composed of a III nitride multilayer made of a III nitride film and a III nitride underfilm as mentioned above and plural III nitride films which, in turn, are formed on the III nitride multilayer.

In a semiconductor light-emitting element 40 shown in FIG. 4, a III nitride underfilm 2 and a III nitride film 3 are formed so as to satisfy the above-mentioned requirements of the present invention and are formed on a substrate 1 made of e.g., sapphire single crystal. The III nitride underfilm 2 and the III nitride film 3 constitute an underfilm 4 for a semiconductor element.

On the underfilm 4 are formed a first conductive layer 25, a light-detecting layer 27, and a second conductive layer 29 which in turn are made of their respective III nitride films. The thus obtained semiconductor element 40 is partially etched and removed in the thickness direction, to partially expose the first conductive layer 25. A first electrode 30 is made on the exposed surface of the first conductive layer 25 and a second electrode 31 is made on the second conductive layer 29.

The light-detecting layer 27 is excited by the introduction of a given light, and thus, a given excitation current is generated. The excitation current is measured via the first and the second electrodes 30 and 31, to detect the introduced light.

In the semiconductor element 40 shown in FIG. 4, since the conductive layers 25 and 29, and the light-detecting layer 27 are formed on the underfilm 4 with high crystallinity, their crystallinities are improved and enhanced. Therefore, a dark current is not almost generated, and thus, a given introduced light can be detected at high sensitivity because of the high crystallinity of the semiconductor element 40.

The conductive layers, the cladding layer and the like may be made by mean of a MOCVD method under a normal condition.

EXAMPLES

Example

This invention will be concretely described, hereinafter.

A C-faced sapphire single crystal substrate was employed, and then, set and attracted on a susceptor installed in a quartz reactor. The pressure in the reactor was set to a pressure of 15 Torr, and the substrate was heated to 1200° C. with flowing $H_2$ gas at an average flow rate of 3 m/sec.

Then, a $NH_3$ gas was flown with a $H_2$ carrier gas for five minutes, to nitride the main surface of the substrate. It was turned out that a given nitrided layer was formed at the main surface of the substrate by the nitriding treatment by means of ESCA analysis, and the nitrogen content at a depth of 1 nm from the main surface of the substrate was 7 atomic-percent.

Then, a TMA and an $NH_3$ gas were introduced and supplied as an Al raw material gas and a nitrogen raw material gas with a $H_2$ carrier gas onto the substrate at a ratio of $TMA:NH_3=1:450$, to form an AlN film as the III nitride underfilm in a thickness of 2 μm on the substrate through the epitaxial growth for 120 minutes.

The surface roughness Ra in the range of 5 μm$^2$ of the AlN film was 2 Å and the FWHM X-ray rocking curve value at the (002) plane was 50 seconds, so that it was revelaed that the AlN film has good surface flatness and crystallinity.

Then, the pressure in the reactor was set to a pressure of 100 Torr, and the temperature of the substrate was set to 1050° C. Then, a TMA, a TMG; and an $NH_3$ gas were supplied on the AlN film at a flow ratio of $TMA:TMG:NH_3=1:9:15000$, to form an $Al_{0.1}Ga_{0.9}N$ film as the III nitride film in a thickness of 2 μm through the epitaxial growth for 60 minutes and thereby, fabricate a III nitride multilayer.

When the crystallinity of the $Al_{0.1}Ga_{0.9}N$ film was examined by means of X-ray analysis, it was revealed that the FWHM X-ray rocking curve at the (002) plane was 120 seconds and the FWHM X-ray rocking curve value at the (100) plane was 450 seconds.

Comparative Example

Except that a GaN buffer layer was formed at a low temperature of 600° C. instead of the AlN underfilm, an $Al_{0.1}Ga_{0.9}N$ film was made in the same manner in Example. When the crystallinity of the $Al_{0.1}Ga_{0.9}N$ film was examined by means of X-ray analysis, it was revealed that the FWHM X-ray rocking curve value at the (002) plane was 300 seconds and the FWHM X-ray rocking curve value at the (100) plane was 1000 seconds.

As is apparent from Example and Comparative Example, the $Al_{0.1}Ga_{0.9}N$ film which is formed on the AlN film as an III nitride underfilm has good crystallinity at the (001) plane and the (100) plane.

Although the present invention was described in detail with reference to the above examples, this invention is not limited to the above disclosure and variations and modifications may be made without departing from the scope and spirit of the present invention. For example, the above III nitride film and the above III nitride underfilm may be made in the same reactor continuously or their respective different reactors. Moreover, the III nitride underfilm may be made in a given reactor and then, the substrate including the underfilm may be taken out of the reactor and set in the same reactor again so as to form the III nitride film.

Although in the above embodiment, the AlGaN film is made directly on the AlN underfilm, a buffer layer or a multilayered structure such as a distorted super lattice structure may be formed between the films so as to enhance the crystallinity of the III nitride film. In this case, the temperature of the substrate, the flow rates of raw material gases, the pressure in an apparatus, the amounts supplied of raw material gases and the sort of an additive gas are appropriately selected and controlled.

As mentioned above, an Al-including III nitride film which has the higher crystallinities of the (100) plane and the (001) plane simultaneously can be provided, and a III nitride multilayer composed of the III nitride film can be provided. If a semiconductor element is made of the III nitride multilayer and plural III nitride films which are in turn stacked on the multilayer, the crystallinity of the semiconductor element can be enhanced due to the high crystallinity of the III nitride film, so that the performance of the semiconductor element can be developed.

What is claimed is:

1. A III nitride film comprising:
a full width at half maximum X-ray rocking curve value of 800 seconds or below at (100) plane; and
a full width at half maximum X-ray rocking curve value of 200 seconds or below at (002) plane.

2. A III nitride film comprising:
a full width at half maximum X-ray rocking curve value of 500 seconds or below at (100) plane; and
a full width at half maximum X-ray rocking curve value of 150 seconds or below at (002) plane.

3. A III nitride multilayer comprising:
a given substrate;
a III nitride underfilm including an Al content of 50 atomic percent or more for all of the III elements present in the III nitride underfilm; and
a III nitride film including Al and having a lower Al content than the Al content of said III nitride underfilm by 10 atomic atomic percent or more, wherein
a full width at half maximum X-ray rocking curve value of said III nitride film is set to 800 seconds or below at (100) plane, and a full width at half maximum X-ray rocking curve value of said III nitride film is set to 200 seconds or below at (002) plane.

4. A III nitride multilayer as defined in claim 3, wherein said full width at half maximum X-ray rocking curve value of said III nitride film is set to 500 seconds or below at (100) planes and said full width at half maximum X-ray rocking curve value of said III nitride film is set to 150 seconds or below at (002) plane.

5. A III nitride multilayer as defined in claim 3, wherein the Al content of said III nitride underfilm is set to 70 atomic percent or more for all of the III elements present in said III nitride underfilm.

6. A III nitride multilayer as defined in claim 5, wherein said III nitride underfilm comprises AlN.

7. A III nitride multilayer as defined in claim 3, wherein the Al content of said III nitride file is set lower than the Al content of said III nitrite underfilm by 20 atomic percent or more.

8. A III nitride multilayer as defined in claim 3, wherein said III nitride underfilm is made at 1100° C. or more.

9. A III nitride multilayer as defined in claim 8, wherein said III nitride underfilm is made at a temperature within 1100–1250° C.

10. A III nitride multilayer as defined in claim 3, wherein said substrate comprises a sapphire single crystal of which a main surface is nitrided, and said III nitride underfilm is formed on said main surface of said substrate.

11. An underfilm for a semiconductor element comprising a III nitride multilayer as defined in claim 3.

12. A semiconductor element comprising an underfilm for a semiconductor element as defined in claim 11.

* * * * *

UNITED STATES PATENT AND TRADEMARK OFFICE
CERTIFICATE OF CORRECTION

PATENT NO. : 6,765,244 B2 Page 1 of 1
DATED : July 20, 2004
INVENTOR(S) : Tomohiko Shibata et al.

It is certified that error appears in the above-identified patent and that said Letters Patent is hereby corrected as shown below:

Column 8,
Line 17, add -- , -- after "planes"
Line 27, change "file" to -- film --

Signed and Sealed this

Thirtieth Day of November, 2004

JON W. DUDAS
*Director of the United States Patent and Trademark Office*